United States Patent [19]

Mennitt et al.

[11] Patent Number: 5,334,857
[45] Date of Patent: Aug. 2, 1994

[54] SEMICONDUCTOR DEVICE WITH TEST-ONLY CONTACTS AND METHOD FOR MAKING THE SAME

[75] Inventors: Timothy J. Mennitt, Cedar Park; John P. Warren; James W. Sloan, both of Austin, all of Tex.

[73] Assignee: Motorola, Inc., Schaumburg, Ill.

[21] Appl. No.: 864,246

[22] Filed: Apr. 6, 1992

[51] Int. Cl.⁵ .............................. H01L 23/02
[52] U.S. Cl. ........................ 257/48; 257/692; 257/737; 257/778; 257/786
[58] Field of Search ............ 257/48, 692, 737, 778, 257/786, 787

[56] References Cited

U.S. PATENT DOCUMENTS

| | | | |
|---|---|---|---|
| 4,437,141 | 3/1984 | Prokop | 257/784 |
| 4,437,141 | 3/1984 | Prokop | 361/403 |
| 4,881,029 | 11/1989 | Kawamura | 257/48 |
| 4,975,765 | 12/1990 | Ackermann et al. | 257/737 |
| 5,065,227 | 11/1991 | Frankeny et al. | 257/48 |

FOREIGN PATENT DOCUMENTS

| | | | |
|---|---|---|---|
| 63751 | 4/1984 | Japan | 257/787 |
| 2211648 | 8/1990 | Japan | 257/48 |

OTHER PUBLICATIONS

Semiconductor Wafer Testing, D. E. Shultis, Dec. 1970, IBM Technical Disclosure Bulletin vol. 13 No. 7 p. 1793.

*Primary Examiner*—Rolf Hille
*Assistant Examiner*—Roy Potter
*Attorney, Agent, or Firm*—Patricia S. Goddard

[57] ABSTRACT

A semiconductor device has test-only contacts to reduce the size of the device and eliminate unnecessary external contacts. In one form of the invention, a semiconductor device (30) is provided with solder balls (26) which are electrically coupled to those portions of a semiconductor die (20) that are necessary for device operation. The device also includes test pads (32) formed on a package substrate (12) which are electrically coupled to those portions of the die which are necessary only for a manufacturer's testing purposes. In another form, a semiconductor device (10) includes external test-only solder balls along the periphery of the package substrate, for example solder balls between boundaries A and B. After testing is complete, the package substrate is excised along boundary A, thereby eliminating solder balls which are not needed by the device user. A combination of the two techniques may also be used.

22 Claims, 5 Drawing Sheets

SEMICONDUCTOR DEVICE WITH TEST-ONLY CONTACTS AND METHOD FOR MAKING THE SAME

CROSS-REFERENCE TO A RELATED APPLICATION

The present application relates to a commonly assigned, co-pending application by James W. Sloan entitled, "Semiconductor Device With Test-Only Leads," Ser. No. 07/864,255, filed Apr. 6, 1992.

FIELD OF THE INVENTION

The present invention relates to semiconductor devices in general, and more specifically to semiconductor devices having test-only contacts and methods for making the same.

BACKGROUND OF THE INVENTION

Semiconductor manufacturers are continually driven to make semiconductor devices smaller, particularly in regard to consumer electronics applications. A problem for many manufacturers in achieving smaller devices is the need to extensively test devices prior to shipment to customers. Upon completion of device fabrication, manufacturers conduct electrical tests on the device to ensure that each circuit of the device is functioning properly. In order to accomplish this testing, each circuit must be electrically accessible. Electrical access to the circuits is achieved through external contacts which are electrically coupled to bond pads of a semiconductor die. The external contacts may take one of several forms, such as conductive pins, solder balls, or leads. In many instances, some of the external contacts and bond pads which are necessary to test the device are not required during device operation. Due to the presence of the contacts and bond pads which are used only for testing purposes and not in an operational mode, semiconductor devices can be much larger than is actually required for device operation.

SUMMARY OF THE INVENTION

The present invention enables semiconductor manufacturers to extensively test semiconductor devices yet provide customers with devices having a minimal number of external contacts. In one form of the invention, a semiconductor device includes a package substrate. A plurality of external operational contacts are attached to a surface of the package substrate and a plurality of test-only contacts are formed on a surface of the package substrate. A semiconductor die is positioned on the package substrate. A first portion of the semiconductor die is electrically coupled to the plurality of external operational contacts. A secodn portion of the semiconductor die is electrically coupled to the plurality of test-only contacts. The second portion of the semiconductor die is excluded from the first portion.

These and other features, and advantages, will be more clearly understood from the following detailed description taken in conjunction with the accompanying drawings. It is important to point out that the illustrations are not necessarily be drawn to scale, and that there may be other embodiments of the present invention which are not specifically illustrated.

DETAILED DESCRIPTION OF A PREFERRED EMBODIMENT

As discussed earlier, many semiconductor devices have more external contacts than are required by a user for device operation. By eliminating the external contacts which are not needed for operation, the size of a semiconductor device can be significantly reduced. In accordance with the present invention, a semiconductor device includes only external contacts which are needed by the device user during device operation, but allows the device manufacturer complete electrical access to the device for test purposes. In one form of the invention, contacts which are used for test purposes by device manufacturers are removed from the device prior to shipment to customers. Another form of the invention establishes test contacts which are configured differently than external contacts that are used during device operation, and in turn occupy less area. Using either form of the invention, or a combination of both forms, permits the size of a semiconductor device to be significantly reduced since external test contacts having the same configuration as external operational contacts are eliminated. While external operational contacts are constrained to standard positions and configurations, test contacts implemented in accordance with the present invention have no such constraints. Placement, size, and configuration of test contacts that are not need during device operation is left to the discretion of the semiconductor manufacturer. The flexibility of test contact placement and configuration results in a smaller device size. Moreover, the size advantage is achieved without an increase in device cost and without an increase in mounting complexity for the device user.

Figure 7:
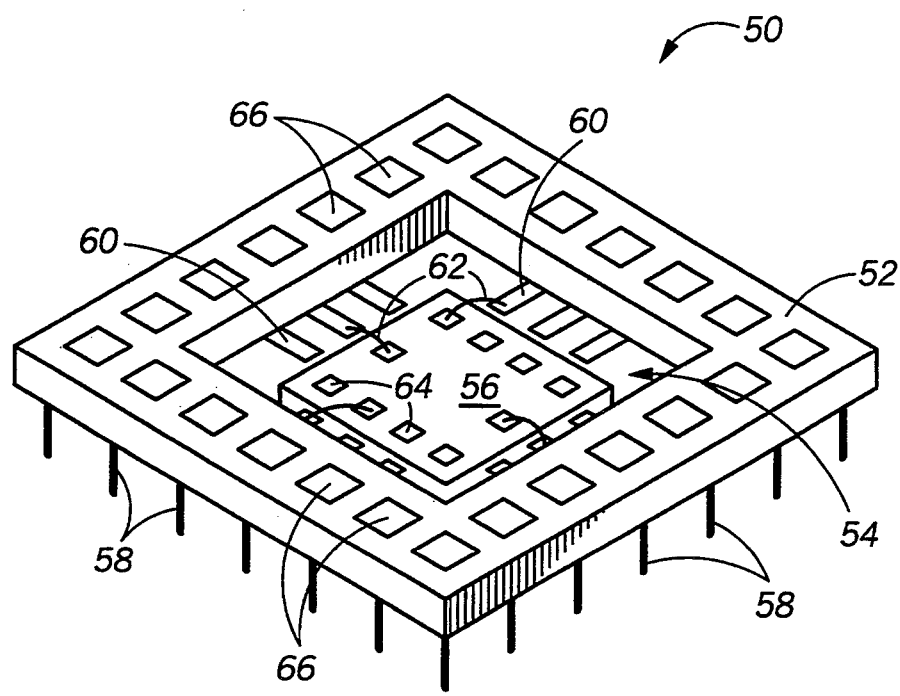
FIG. 7 is a perspective of a pin grid array (PGA) semiconductor device also in accordance with the present invention.

Much of the remaining description of the present invention is direced to semiconductor devices which employ a packaging technology referred to as overmolded pad array carriers (OMPAC). However, it is important to realize that the present invention is also applicable to other packaging technology, including multichip modules, pin grid array (PGA) packages, ceramic dual inline plastic (DIP), and the like. An example of how the present invention is applicable to PGA packages is illustrated in FIG. 7.

Figure 1:
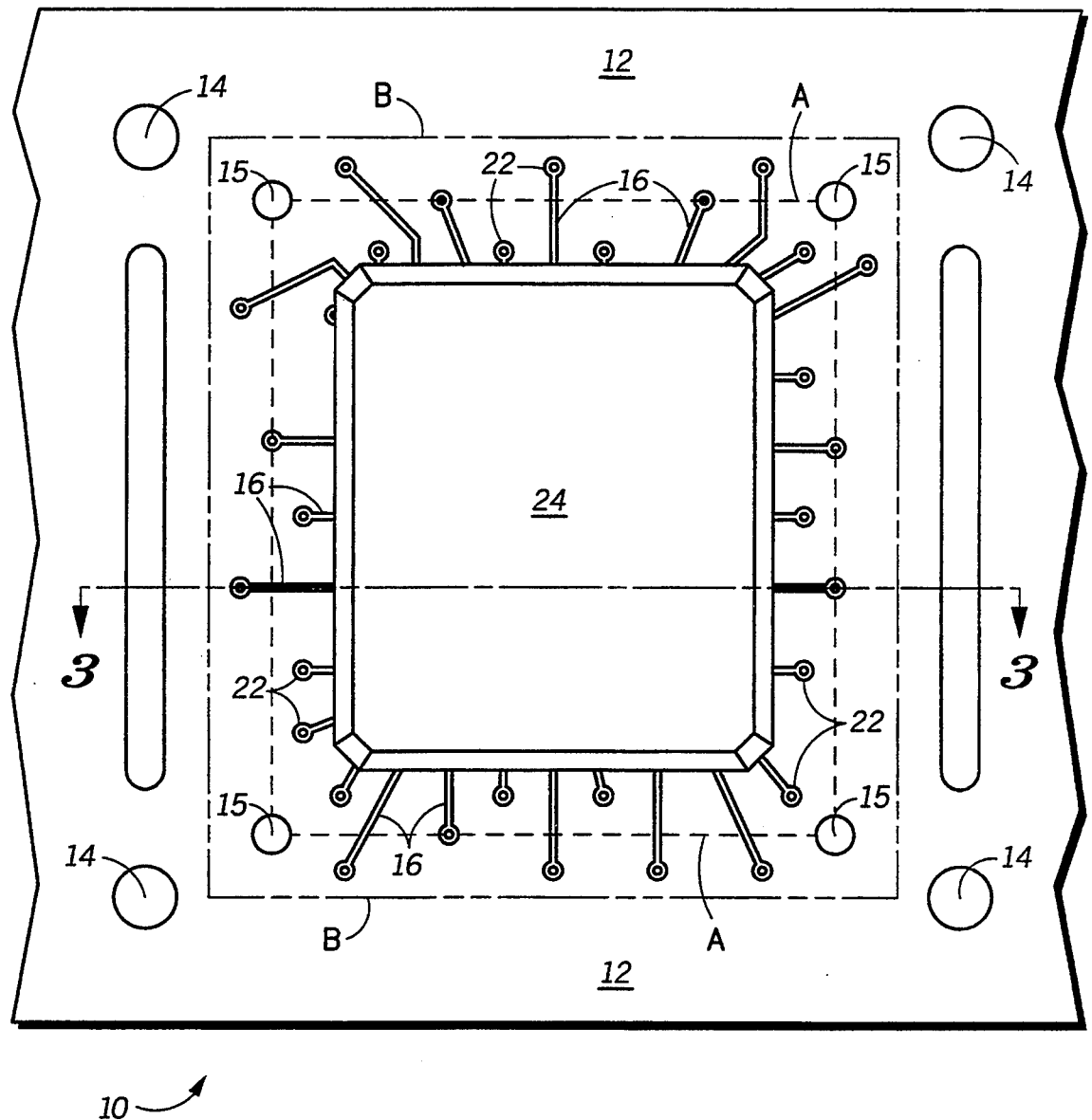
FIG. 1 is a top view of an over-molded pad array carrier (OMPAC) semiconductor device in accordance with the present invention.

FIG. 1 illustrates a top view of an OMPAC semiconductor device 10 in accordance with the present invention. Device 10 includes a package substrate material 12, which is illustrated as a portion of a strip of material. In a preferred embodiment of the present invention, package substrate 12 is a bismaleimide-triazine resin (also know as BT resin) which is formed into a thin, flexible stripe or tape. The BT resin may be formed as a composite material having glass fibers throughout. Similarly, package substrate 12 may be a thin, epoxy-glass composite material, similar to the materials used for printed circuit boards. The package substrate material is in strip form to facilitate automated manufacturing of multiple semiconductor devices, although use of a package substrate material in strip form is not required in practicing the invention. Also to facilitate manufacturing, package substrate 12 has strip alignment holes 14 which are used to accurately index the strip through manufacturing equipment. Device alignment holes 15 are provided in the package substrate and are used to align device 10 to manufacturing equipment once the device has been singulated or excised from the strip. Both the strip alignment holes and device alignment holes extend completely through the package substrate from a top surface to a bottom surface.

Figure 3:
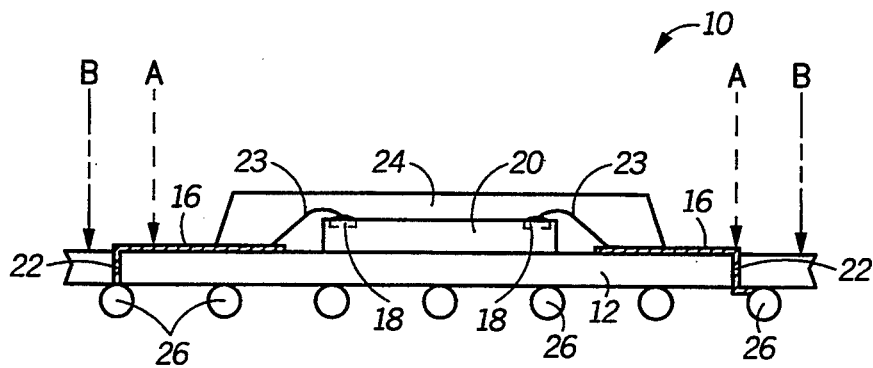
FIG. 3 is a cross-sectional view of the semiconductor device of FIG. 1 taken along the line 3—3.

Formed on the top surface of package substrate 12 is a plurality of conductive traces 16. As illustrated in FIG. 3, each conductive trace electrically couples a terminal or bond pad 18 of a semiconductor die 20 to an electrically conductive via 22. FIG. 3 illustrates a cross-sectional view of device 10 taken along the line 3—3 of FIG. 1. The conductive traces are electrically coupled to the die by conductive wires 23 which are similar to wires used in conventional semiconductor devices. As alternatives to using conductive wires, tape automated bonding (TAB), flip-chip techniques, and the like, may be used to electrically couple the die to the conductive traces. Conductive traces 16 are preferably copper or a plated copper material, such as gold-plated or nickel-plated copper, although other electrically conductive materials are suitable for use in the invention. Vias 22 extend from the top surface of the package substrate to the bottom surface, and are typically plated with a conductive material along via sidewalls. Alternatively, vias may be filled with an electrically conductive material to provide electrical continuity through each via. The traces and vias are formed on package substrate 12 using conventional methods, for instance screen printing, plating, lithography, and etching techniques.

As illustrated in both FIG. 1 and FIG. 3, device 10 also includes a package body 24 which encapsulates semiconductor die 20, wire bonds 23, portions of conductive traces 16, and portions of the top surface of package substrate 12. Vias 22 may or may not be encapsulated by package body 24, depending on the location of vias in the package substrate. In a preferred embodiment of the present invention, package body 24 is formed of a molded plastic or epoxy resin which can be formed over die 20 using conventional one-sided molding equipment and materials. However, any encapsulant which provides adequate environmental protection to the die is suitable for use in the present invention, including pre-formed plastic or ceramic package bodies or dispensed plastics known as glob top packages.

Figure 2:
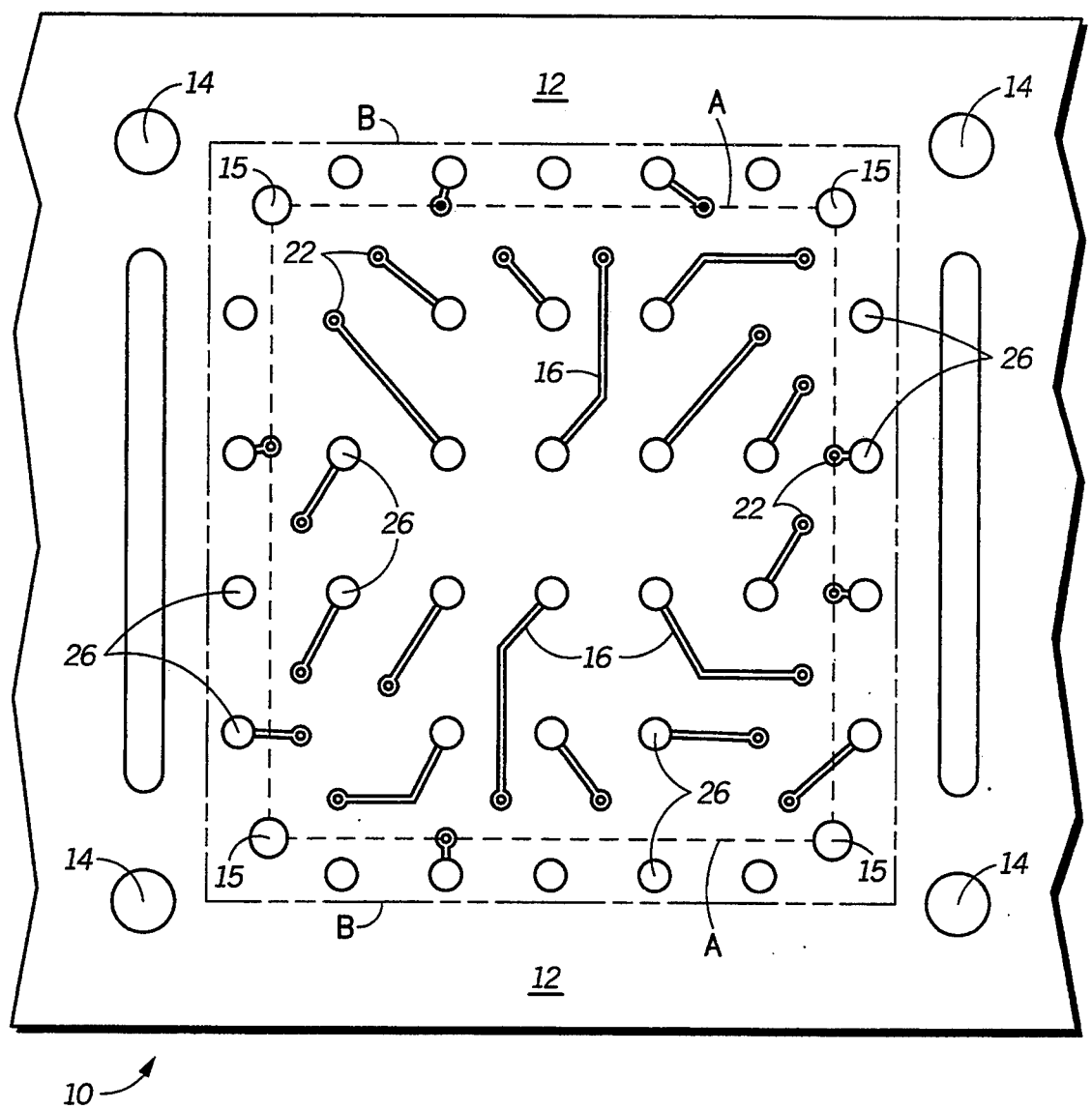
FIG. 2 is a bottom view of the semiconductor device of FIG. 1.

In accordance with one embodiment of the present invention, each conductive trace formed on the top of package substrate 12 is routed to a solder ball 26 on the bottom of the package substrate by conductive vias 22. The bottom of device 10, including package substrate 12 and solder balls 26, is illustrated in FIG. 2. Some vias are directly coupled to solder balls while other vias are routed to solder balls by conductive traces formed on the bottom of the package substrate. Solder balls which are directly coupled to vias are preferably filled vias to avoid substantial solder wicking into the via. Solder balls 26 are attached to device 10 by providing a conductive solder pad (not illustrated because the pads are hidden by the solder balls) on the package substrate at the end of a conductive trace or surrounding a conductive via. A pre-formed solder ball is positioned in contact with the solder pad and is reflowed to form a metallurgical bond between the solder pad and solder ball. Solder pads are formed on the package substrate by conventional techniques, usually at the same time conductive traces 16 are formed, and are of a material which is readily bonded to solder, such as a nickel-plated or gold-plated material.

The solder balls of device 10 are external contacts which are used to electrically access semiconductor die 20. In an application, device 10 is mounted to a user substrate (not illustrated), such as a printed circuit board. Upon mounting device 10, solder balls 26 correspond in position to conductive pads or terminals formed on the user substrate. The solder balls are reflowed and bonded to the pads, thereby affixing the device to the user substrate.

As mentioned previously, some of the external contacts of a semiconductor device may not be necessary in a user application, but are used only for a manufacturer's internal testing. These unnecessary external contacts undesirably increase the overall size of a semiconductor device. As is evident from the cross-section of FIG. 3, the external contacts, in this case solder balls 26, take up a substantial portion of the overall device size or area. Although positioning the solder balls closer together would reduce size of the device, there is a lower limit to the solder ball spacing or pitch for a given solder ball diameter from a manufacturing point of view. As solder balls are placed closer together, it is more difficult for a user to mount the device to a substrate, such as a printed circuit board. Upon reaching a manufacturable lower limit to solder ball spacing, size reductions to the device are difficult, if not impossible to make. In accordance with the present invention, the size of a semiconductor device is reduced by removing the external test contacts not needed by the user or by configuring the test contacts in a way which does not require additional space.

With respect to removing unnecessary external test contacts, full functional testing of a device in accordance with the present invention can be accomplished because contacts are removed after test operations. Size of a device is reduced because the contacts which are removed are positioned around the periphery of the device. As illustrated in FIGS. 1 and 2, device 10 includes two boundaries, boundary A and boundary B. Boundary A defines the size of device 10 as the device is provided to a user. Within boundary A are all external contacts (solder balls) and all electrical connections to semiconductor die 20 which are necessary for user-defined device operation (some device users may require more contacts than others). Boundary B defines the size of device 10 required to include all external contacts necessary for device operation and for the manufacturer's internal testing. Thus, a difference between boundaries A and B is that the external contacts needed only for testing purposes (hereinafter referred to as test-only contacts) are contained within boundary B, but are excluded from boundary A. In other words, the test-only contacts are positioned peripherally around the device. In reference to FIG. 2, the solder balls positioned between boundary A and boundary B are used for the manufacturer's testing purposes and the solder balls positioned within boundary A are used for device operation in a user application. It is important to also point out that the solder balls or contacts within boundary A may also be used during device testing. However, the solder balls between boundaries A and B, the test-only contacts, cannot be needed for user-defined device operation.

By having the test-only solder balls located about the periphery, the portion of package substrate 12 to which the test-only solder balls are attached can be removed after testing, thereby reducing the size of the device provided to a user. The size reduction achieved as a result of removing portions of the package substrate is apparent in viewing FIG. 3. Upon completing fabrication of device 10 in strip form, the device is ready for testing. Testing can be accomplished either in strip form, or each device of the package substrate strip can be singulated and individually tested. If singulating the devices prior to testing, package substrate 12 is cut using conventional methods along boundary B. In reference to the cross-sectional view of FIG. 3, there are seven solder balls attached to the illustrated portion of device 10 after singulating the device from the package substrate strip along boundary B. Device 10 is then tested in a known manner. During device testing, semiconductor die 20 is electrically accessed by the solder balls present on the bottom of package substrate 12. Upon completion of device testing by the manufacturer, the test-only solder balls located around the device periphery are removed by cutting the package substrate along boundary A. In reference to FIG. 3, two solder balls (the leftmost and rightmost solder balls) are removed upon cutting substrate 12 along boundary A. With respect to FIG. 2, a total of eighteen solder balls are removed upon cutting along boundary A. As a result, the size of device 10 that is sent to a user is considerably smaller than if the device included the test-only solder balls as in conventional devices. If singulating the devices after testing, only one excising operation is necessary. The devices are tested in strip form and the package substrate is then cut along boundary A.

As an example of the size reduction achieved in practicing the present invention, a conventional 144-pin OMPAC device having solder balls arranged in twelve rows and twelve columns has an area on the order of 264 mm$^2$ (16.25 mm $\times$ 16.25 mm). Assume that forty-four of the pins of the conventional device are not needed by the user, but are necessary for manufacturer's testing purposes. In practicing the present invention, a 100-pin OMPAC having an area on the order of 176 mm$^2$ (13.25 mm $\times$ 13.25 mm) could be used in place of the 264 mm$^2$ 144-pin OMPAC without sacrificing functionality. This comparison is based on using solder balls having a diameter of 30 mils (about 0.76 mm) and a solder pad pitch of 60 mils (about 1.52 mm). In addition, the cost of the smaller device in accordance with the invention is not significantly changed compared to the larger conventional device. No additional manufacturing steps are required if the devices are tested in strip form. Only one additional step is required if the devices are removed from the strip prior to testing, namely that of cutting the package substrate to removed the test-only contacts. Furthermore, the user receives the benefit of a smaller device without an increase in mounting complexity since solder ball spacing is unchanged in comparison to spacing in conventional devices.

A possible disadvantage of removing the test-only contacts of a semiconductor device is that electrical access to certain portions of a semiconductor die becomes extremely difficult, if not impossible. Not having full access to the die can create problems for users and manufacturers when it comes to debugging or performing failure analysis on the device. There are several methods of overcoming this problem in accordance with the present invention. One method is to configure the conductive traces and conductive vias associated with the test-only contacts to permit electrical access to portions of the die even after the test-only contacts have been removed. For example, FIG. 3 illustrates that boundary A cuts through one of the conductive vias. From FIG. 2 it is apparent that boundary A cuts through several vias. Upon cutting along boundary A through these vias, castellations 28 are formed along the periphery of the package substrate, as illustrated in a perspective view of device 10 in FIG. 4. Because vias 22 are electrically conductive the whole way through the package substrate, castellations 28 are also electrically conductive. Therefore, access to the test portions of semiconductor die 20 can be achieved through the conductive castellations. Test probes can be abutted to the conductive castellations to perform certain testing operations after the external test-only solder balls have been removed. Notice that not all vias associated with test-only solder balls are formed into castellations, but that some vias are completely removed from the device upon cutting along boundary A. A device manufacturer may provide the more useful or significant test contacts with castellations, while providing no electrical access to others.

Figure 4:
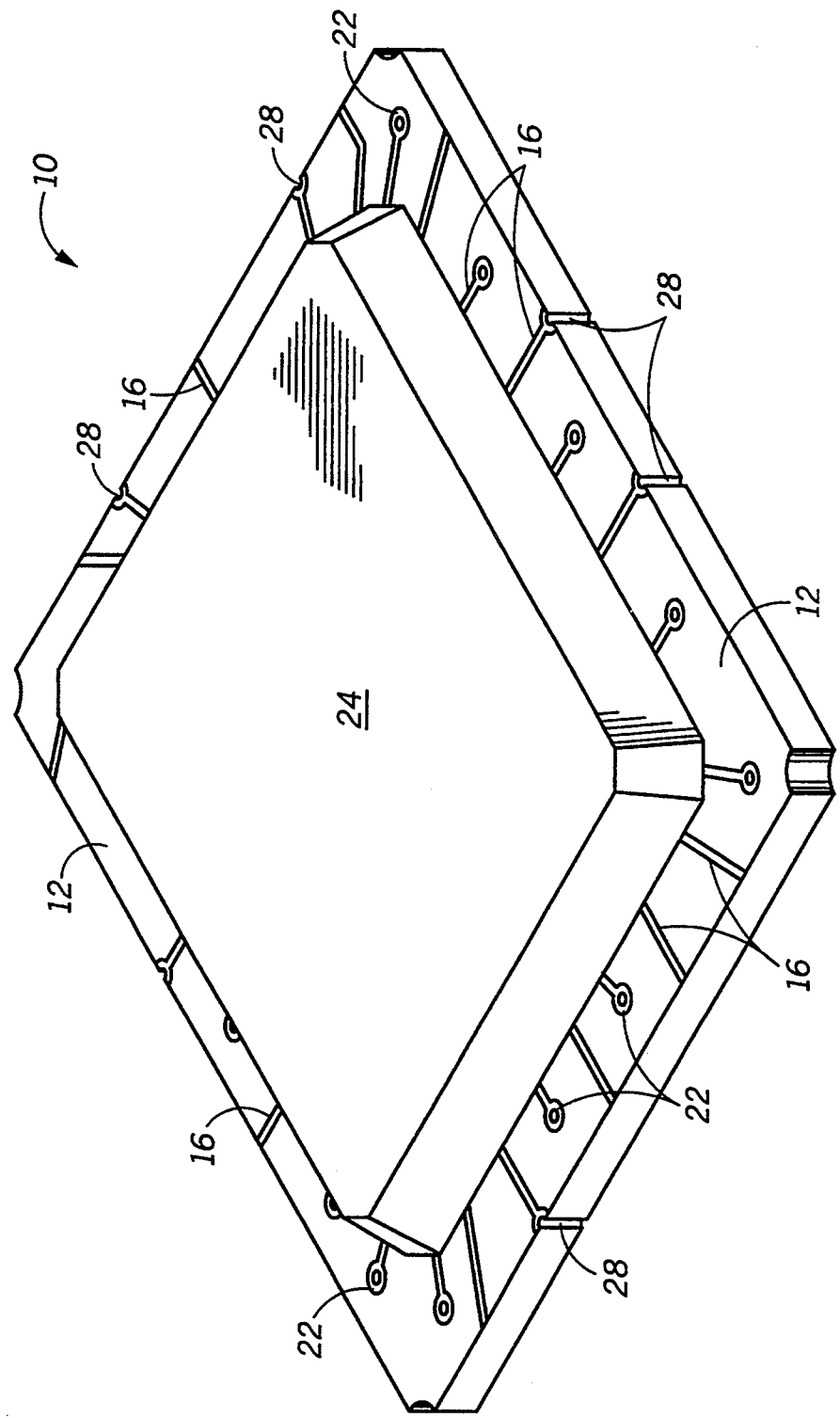
FIG. 4 is a perspective view of the semiconductor device of FIG. 1 after being excised from a package substrate strip along boundary A, in accordance with the present invention.

It may appear from FIG. 4 that one may just as easily use conductive traces 16 formed on the top of package substrate 12 to electrically access test portions of the semiconductor die, as opposed to using conductive castellations 28. However, in using many of the conventional OMPAC manufacturing techniques, conductive traces 16 may be covered completely, or in part, by a solder resist or a solder mask (not illustrated). Solder resist materials are well known in semiconductor manufacturing and are used to mask or protect appropriate areas from subsequent solder applications. Thus, conductive traces on the top of a package substrate may not be available for electrical contact if covered by solder resist. Castellations 28, on the other hand, have exposed conductive regions along the periphery of package substrate 12 which are suitable for contacting and would not be covered by solder resist.

Figure 5:
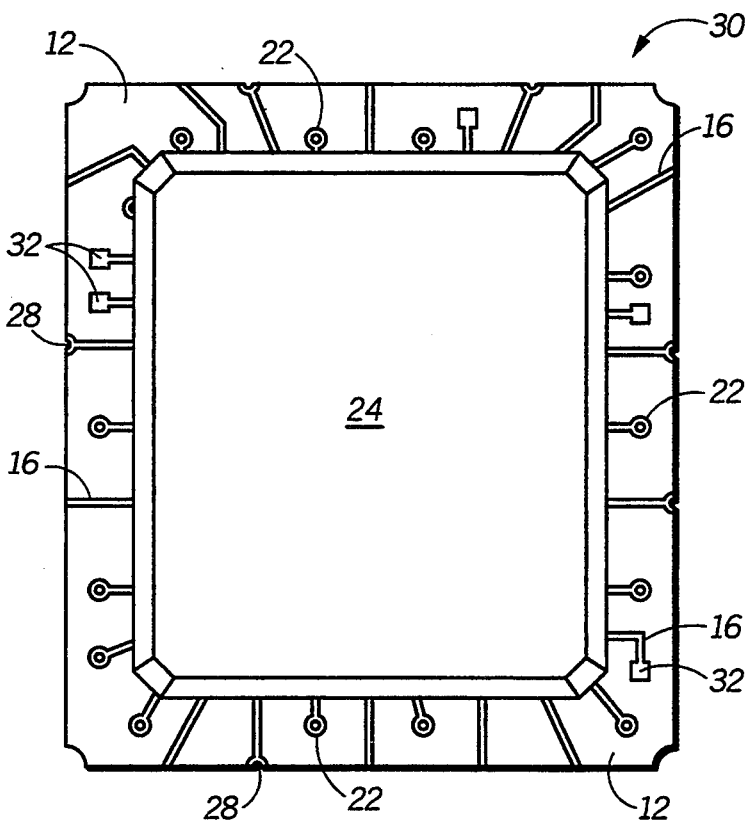
FIG. 5 is a top view of an OMPAC semiconductor device also in accordance with the present invention which includes top-side test pads.
Figure 6:
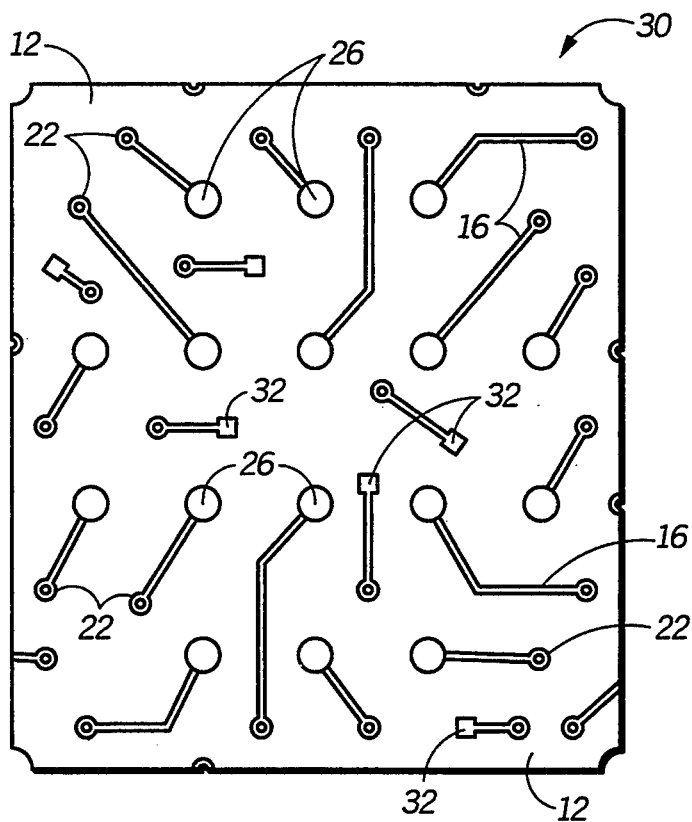
FIG. 6 is a bottom view of an OMPAC semiconductor device also in accordance with the present invention which includes bottom-side test pads.

In accordance with the present invention, there are additional methods for electrically accessing test portions of a semiconductor die after external test contacts have been removed. FIGS. 5 and 6, which are respectively top and bottom views of a semiconductor device 30, illustrate two such methods. Device 30 is similar to device 10 of FIGS. 1–4, and includes many of the same elements. Analogous elements of the two devices have the same reference labels. As illustrated in FIG. 5, device 30, unlike device 10, includes a plurality of test pads 32 formed on top of package substrate 12. The test pads can be formed on the package substrate at the same time conductive traces 16 are formed, and may be of a similar or the same material. Although the test pads are illustrated as being square, any test pad shape may be used in accordance with the present invention. The size of the test pads should be sufficient to enable a test probe to reliably contact the pad. Test pads 32 formed at the ends of selected conductive traces 16, or along any portion of a conductive trace, will provide appropriate electrical continuity. The conductive traces having test pads 32 are routed under package body 24 and are electrically coupled to bond pads of a semiconductor die (not shown) which are used for device testing, but which are not needed for user-defined device operation. Thus, test pads 32 enable certain electrical testing to be performed on device 30, even though test-only external contacts, such as solder balls, have be excised from the device. Because contact to the test pads is not necessary for device operation, the test pads do not have to be coupled to external contacts and device size can be minimized.

From the foregoing discussion, it is apparent that supplemental test pads can be included in a semiconductor device to permit testing of the device after external test-only contact have been removed. In accordance with another embodiment of the present invention, test pads can be provided in place of test-only external contacts. Rather than routing a conductive trace to a peripheral test-only solder ball and excising the solder ball after device testing, the device may be tested using test pads. As an example in reference to FIG. 5, the conductive traces designated for test-only purposes may include test pads 32 or castellations 28. These conductive traces are not routed to solder balls or any type of external contact on the bottom of the package substrate. Only those conductive traces which are used during device operation are routed to solder balls or other external contacts.

The use of test pads in place of external test-only contacts may require special testing equipment which provides contact to both test pads and another type of external contact, such as solder balls, since the external operational contacts are often used during device testing. As illustrated in FIG. 5, test pads 32 are provided on the top surface of package substrate 12 whereas solder balls are attached to the bottom surface. However, testing equipment which provides both top-side and bottom-side contact is not required to test a device formed in accordance with the present invention because test pads 32 may be formed on the bottom of package substrate 12 as well. A bottom view of device 30 is illustrated in FIG. 6 and includes bottom-side test pads 32. Although test pads 32 of FIG. 6 are formed on the package substrate and solder balls 26 extend away from the package substrate surface a distance roughly equal to the solder ball diameter, both the solder balls and test pads can be contacted during testing with conventional testing equipment. A suitable testing technique employs the use of test probes known as pogo-pins. Pogo-pins are spring loaded pins that have adjustable positions. The spring forces the pin outward until the pins meets an opposing surface, namely a contact. For example, in testing device 30 of FIG. 6 using a plurality of pogo-pins, the pogo-pins aligned to the solder balls would extend outward until contacting the solder balls, whereas the pogo-pins aligned to the test pads would extend further to contact the test pads.

The are several advantages to using test pads 32, either alone or in combination with peripheral test-only contacts which are removed from the device. One advantage is that spacing limitations of test pads are more relaxed than those of solder balls. Test pads are lithographically defined on the package substrate, and therefore can be made quite small. The only size limitation to the test pads is that a test probe, such as a pogo-pin, be able to reliably contact the pad. Because the test pads can be made small and placed closed together, numerous test pads can be placed among solder balls on the bottom of a package substrate and also among conductive traces on the top of the package substrate. As a result, size of a semiconductor device in accordance with the present invention is reduced in comparison to conventional devices which have external pins or contacts that are not used during device operation. Used alone, test pads have the advantage of utilizing a smaller package substrate area than if external test-only contacts are included. Furthermore, the need to cut portions of the package substrate which have external test-only contacts is eliminated, which may result in fewer manufacturing steps. The use of test pads in conjunction with external test-only contacts which are excised before shipment to a customer also has an advantage. Manufacturer's testing can be accomplished using solely external contacts of a device. However, supplemental test pads enable electrical accessibility to certain portions of a semiconductor die which are otherwise lost upon excising external test-only contacts from the device. Using supplemental test pads in conjunction with external contacts which are designated as test-only contacts permits debugging and failure analysis to be performed on the device even though the original test-only contacts are removed.

The present invention can be practiced with semiconductor devices other than OMPAC devices. For example, illustrated in FIG. 7 is a pin grid array (PGA) semiconductor device 50 in accordance with the present invention. Device 50 includes a package substrate 52, which as in many conventional PGA devices is a preformed, multilayer ceramic package. Package substrate 52 includes a cavity 54 for housing a semiconductor die 56. Attached to a bottom surface of package substrate 52 is a plurality of external operational contacts or pins 58. The operational pins are electrically routed to a plurality of conductive traces 60 formed on a surface of the package substrate within cavity 54. Electrical routing is achieved through various conductive layers and conductive vias (not shown) throughout package substrate 54, as is well known in the art. The operational pins are electrically coupled to portions of semiconductor die 56 used during device operation by the conductive traces and by wire bonds 62 which are bonded to bond pads 64 of the die. For purposes of clarity, not all conductive traces, bond pads, or wire bonds that would normally be associated with device 50 are illustrated. Nonetheless, one skilled in the art will clearly understand the essential aspects of the invention.

As illustrated in FIG. 7, package substrate 52 also includes a plurality of test contacts or pads 66 formed on a top surface of the substrate. Alternatively, the test pads may instead be formed on a bottom surface of the substrate or on a combination of both the top and bottom surfaces. Test pads 66 are formed on the package substrate using conventional techniques, such as plating, screen printing, or the like. In accordance with the present invention, test pads 66 are electrically coupled to portions of semiconductor die 56 which are used during device testing, and not during user-defined device operation. The test pads are also coupled to the die by conductive vias (not shown), conductive traces, wire bonds, and bonding pads, as are external operational pins 58. A difference between the electrical coupling of the test pads and the operational pins to the die is that the test pads are coupled to a first set of bond pads which access test portions of the die, whereas the operational pins are coupled to a second set of bond pads which access operational portions of the die. Although the operational portions of the die may be accessed during device testing, the test portions of the device cannot readily be accessed during normal device operation. In other words, the test portion of the die (which includes the bond pads associated with the test pads) is excluded from the operational portion of the die (which includes the bond pads associated with the external operational pins). The converse is not necessarily true since, as mentioned earlier, some operational portions of the die are accessed during device testing. Utilizing test pads 66 eliminates the need to bring all conductive traces and bond pads out of the package substrate in the form of external pins. Consequently, device 50 can be made smaller than conventional PGA devices.

The foregoing description and illustrations contained herein demonstrate many of the advantages associated with the present invention. In particular, it has been revealed that a semiconductor devices which utilizes test-only contacts is considerably smaller than an equivalent conventional device. In spite of the smaller size, semiconductor devices formed in accordance with the present invention do not increase manufacturing complexity either to the device manufacturer or to the device user. In addition, the cost of semiconductor device in accordance with the invention is about equal to that of a conventional devices since manufacturing changes in practicing the present invention are minimal.

Thus it is apparent that there has been provided, in accordance with the invention, a semiconductor device and method for making the same that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, with respect to OMPAC devices, the number of rows or columns of test-only contacts, such as solder balls, is not restricted by the present invention. Furthermore, the number of semiconductor die within a device is not limited to one. In addition, the invention is not limited to employing a molded plastic body or to those materials specifically described and illustrated herein. It is also important to realize that test pads in accordance with the present invention may be formed on a top surface, a bottom surface, or along a periphery of a package substrate. Also, it is not required that each conductive trace having a corresponding conductive via or a corresponding test pad. Conductive traces may either be used for test-only purposes or for user-operation purposes. Those traces for user-operation will have a corresponding external contact, whereas the traces used for test-only purposes will not have a corresponding external contact of the same configuration as the external operational contact, in accordance with the present invention, upon completion of device manufacturing. It is also important to note that the present invention is applicable packaging techniques other than OMPAC, such as multichip modules, PGAs, ceramic DIPs, and the like. Therefore, it is intended that this invention encompass all such variations and modifications as fall within the scope of the appended claims.

We claim:

1. A semiconductor device comprising:
   a package substrate having a top surface, a bottom surface, and a perimeter;
   a plurality of external operational contacts attached to a surface of the package substrate for electrical connection to a user substrate;
   a plurality of test-only contacts formed on a surface of the package substrate; and
   a semiconductor die positioned on the package substrate and electrically coupled to the plurality of operational contacts and the plurality of test-only contacts, wherein the plurality of operational contacts is electrically coupled to a first portion of the semiconductor die and the plurality of test-only contacts is electrically coupled to a second portion of the die, wherein the second portion of the semiconductor die is excluded from the first portion.

2. The semiconductor device of claim 1 wherein the plurality of external operational contacts comprises a plurality of solder balls in an array configuration on the bottom surface of the package substrate.

3. The semiconductor device of claim 2 wherein the plurality of test-only contacts comprises a plurality of solderless conductive pads formed on a surface of the package substrate.

4. The semiconductor device of claim 3 wherein at least one of the plurality of solderless conductive pads is formed on the top surface of the package substrate.

5. The semiconductor device of claim 3 wherein at least one of the plurality of solderless conductive pads is formed on the bottom surface of the package substrate.

6. The semiconductor device of claim 2 wherein at least one of the plurality of test-only contacts comprises a plated castellation along the perimeter of the package substrate.

7. The semiconductor device of claim 1 wherein the package substrate comprises a material selected from the group consisting of: bismaleimide-triazine resins and epoxy-glass composites.

8. A semiconductor device comprising:
   a package substrate having a top surface, a bottom surface, and a perimeter;
   a plurality of conductive vias formed in the package substrate;
   a plurality of solder balls attached to the bottom surface of the package substrate for subsequent connection to a user substrate, each solder ball being electrically coupled to one of the electrical vias;
   a plurality of test-only contacts formed on the package substrate; and
   a semiconductor die positioned on the top surface of the package substrate, the semiconductor die having a first and a second plurality of bond pads, wherein each bond pad of the first plurality of bond pads is electrically coupled to a solder ball by a conductive via and each bond pad of the second plurality of bond pads is electrically coupled to a test-only contact.

9. The semiconductor device of claim 8 wherein the first plurality of bond pads of the semiconductor die is electrically coupled to the plurality of electrical vias by a plurality of conductive wires.

10. The semiconductor device of claim 9 further comprising a molded package body which encapsulates the semiconductor die and the plurality of conductive wires.

11. The semiconductor device of claim 8 wherein each test-only contact comprises a plated pad on a surface of the package substrate.

12. The semiconductor device of claim 8 wherein at least one of the plurality of test-only contacts comprises a plated castellation along the perimeter of the package substrate.

13. The semiconductor device of claim 8 wherein the package substrate comprises a material selected from the group consisting of: bismaleimide-triazine resins and epoxy-glass composites.

14. A semiconductor device comprising:
a package substrate comprising:
a top surface;
a bottom surface;
a first plurality of conductive traces formed on the top surface
a second plurality of conductive traces formed on the top surface;
a plurality of solder ball receiving areas formed on the bottom surface;
wherein only each of the first plurality of conductive traces has a corresponding solder ball receiving area, such that the second plurality of conductive traces is for testing purposes;
a semiconductor die positioned on the top surface of the package substrate and electrically coupled to the first and second plurality of conductive traces;
a package body which encapsulates the semiconductor die and portions of the top surface of the package substrate while providing electrical accessibility to the second plurality of conductive traces.

15. The semiconductor device of claim 14 wherein each conductive trace of the first plurality of conductive traces is electrically coupled to a conductive via which extends from the top surface of the package substrate to the bottom surface and wherein each conductive via is electrically coupled to the corresponding solder ball receiving area of each conductive trace.

16. The semiconductor device of claim 14 wherein each conductive trace of the second plurality of conductive traces is electrically coupled to a solderless test pad.

17. A method for making a semiconductor device comprising the steps of:
providing a semiconductor die having an integrated circuit formed thereon and a plurality of bond pads electrically coupled to the integrated circuit;
providing a package substrate material having a top surface and a bottom surface, and having a plurality of operational contacts and a plurality of test-only contacts;
mounting the semiconductor die on the top surface of the package substrate;
providing means for electrically coupling the plurality of bond pads of the semiconductor die to the plurality of operational contacts and the plurality of test-only contacts;
encapsulating the semiconductor die and a portion of the top surface of the package substrate; and
attaching one of either a pin or a solder ball to only each of the plurality of operational contacts.

18. A method for making a semiconductor device comprising the steps of:
providing a semiconductor die having an integrated circuit formed thereon;
providing a package substrate having a top surface, a bottom surface, a plurality of operational pads arranged in an array having a predetermined boundary, and a plurality of test-only pads arranged outside the boundary of the array of the user pads;
positioning the semiconductor die on the top surface of the package substrate;
providing means for electrically coupling the semiconductor die to the plurality of operational pads and the plurality of test-only pads;
electrically testing the integrated circuit using at least the plurality of test-only pads; and
removing portions of the package substrate which have the plurality of test-only pads while leaving the plurality of operational pads intact.

19. The method of claim 18 further comprising the step of attaching a conductive pin to each of the test-only pads and user pads.

20. The method of claim 18 further comprising the step of attaching a solder ball to each of the test-only pads and user pads.

21. A semiconductor device comprising:
a package substrate having a surface with a plurality of conductive traces formed thereon;
a semiconductor die mounted to the surface of the substrate, the die having a plurality of operational bonding pads and plurality of test-only bonding pads formed on a surface thereof;
means for electrically coupling the plurality of test-only bond pads and the plurality of operational bond pads to the conductive traces of the package substrate; and
a plurality of external terminals attached to the substrate and electrically coupled to only those conductive traces of the substrate which are electrically coupled to the operational bond pads of the die.

22. The semiconductor device of claim 21 wherein the plurality of terminals comprises either a plurality of solder balls or a plurality of pins.

* * * * *